United States Patent
Cho et al.

(10) Patent No.: US 6,724,052 B2
(45) Date of Patent: Apr. 20, 2004

(54) SEMICONDUCTOR DEVICE AND METHOD OF FABRICATING A SEMICONDUCTOR DEVICE

(75) Inventors: Kang-Sik Cho, Kyungki-do (KR); Hoo-Seung Cho, Seoul (KR); Gyu-Chul Kim, Kyungki-do (KR); Yong Park, Seoul (KR); Han-Soo Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/194,300

(22) Filed: Jul. 15, 2002

(65) Prior Publication Data

US 2002/0179979 A1 Dec. 5, 2002

Related U.S. Application Data

(60) Continuation-in-part of application No. 09/892,996, filed on Jun. 28, 2001, now Pat. No. 6,569,743, which is a division of application No. 09/221,979, filed on Dec. 29, 1998, now Pat. No. 6,278,160.

(30) Foreign Application Priority Data

Dec. 31, 1997 (KR) .............................................. 97-80569

(51) Int. Cl.⁷ ............................................... H01L 29/76
(52) U.S. Cl. ...................... 257/384; 257/377; 257/382; 257/384; 257/396; 257/408; 257/412; 257/413; 437/200; 438/162
(58) Field of Search ................................. 257/377, 382, 257/384, 396, 408, 412, 413; 437/200; 438/162

(56) References Cited

U.S. PATENT DOCUMENTS

| | | | |
|---|---|---|---|
| 5,565,383 A | * 10/1996 | Sakai | .......................... 438/664 |
| 5,648,673 A | 7/1997 | Yasuda | |
| 6,008,081 A | 12/1999 | Wu | |
| 6,410,967 B1 | * 6/2002 | Hause et al. | ................. 257/377 |
| 6,518,625 B1 | * 2/2003 | Nishida et al. | .............. 257/344 |

* cited by examiner

*Primary Examiner*—David Nelms
*Assistant Examiner*—Mai-Huong Tran
(74) *Attorney, Agent, or Firm*—Volentine Francos, PLLC

(57) ABSTRACT

A semiconductor device includes a substrate of a first conductive type, and a well region of an opposite second conductive type is formed in the substrate. A first impurity region of the first conductive type extends to a first depth within the well region, and a second impurity region of the first conductive type is spaced from the first impurity region to define a channel region therebetween and extends to a second depth within the well region. Preferably, the second depth is greater than the first depth. A gate electrode is located over the channel region, and a silicide layer is formed at a third depth within the first impurity region. The third depth is less than the first depth, and a difference between the first depth and the third depth is less than or equal to a difference at which a leakage current from the silicide layer to the well region is sufficient to electrically bias the well region through the silicide layer.

40 Claims, 5 Drawing Sheets

SEMICONDUCTOR DEVICE AND METHOD OF FABRICATING A SEMICONDUCTOR DEVICE

CROSS-REFERENCE TO RELATED APPLICATIONS

This is a continuation-in-part of application Ser. No. 09/892,996, filed Jun. 28, 2001 now U.S. Pat. No. 6,569,743, which is a divisional of application Ser. No. 09/221,979, filed Dec. 29, 1998, and now U.S. Pat. No. 6,278,160. The entire contents of said applications and said patent are incorporated herein by reference for all purposes.

BACKGROUND OF THE INVENTION

1. Field of the Invention

The present invention relates to a semiconductor device, and in particular, to a semiconductor device in which a source region silicide layer is used to bias an underlying substrate or well.

2. Description of the Related Art

As semiconductor devices develop toward high integration, high performance, and low voltage operation, a low-resistance gate material is required to reduce the gate length of a transistor and a memory cell through the formation of fine patterns and to improve the device's characteristics. The thickness of a gate insulating layer must in turn become smaller to increase a channel current in a transistor and a memory cell for low voltage operation. Furthermore, in order to prevent short channel effects caused by the decrease in the gate length of a transistor and to ensure a margin against punch-through, the junction depth of the source/drain regions should be reduced and the parasitic resistance, that is, the surface resistance and the contact resistance of the source/drain regions should be reduced.

Under these circumstances, studies have been conducted on a self-aligned silicide (salicide) process to reduce the resistivity of a gate and the sheet and contact resistance of source/drain regions. This self-aligned silicide process operates by forming a silicide layer on the surfaces of the gate and the source/drain regions. The salicide process refers to the selective formation of a silicide layer such as a titanium silicide (TiSiX) layer on a gate electrode and source/drain regions.

FIG. 1 is a vertical sectional view of an N-channel MOS (Metal Oxide Semiconductor) transistor fabricated by a conventional salicide process. As shown in FIG. 1, a gate insulating layer 112 is grown by performing a thermal oxidation on the surface of a silicon substrate 110 that has an active region on it, defined by a field oxide film (not shown). A conductive layer such as a polysilicon is then deposited for use as a gate, on the gate insulating layer 112 by CVD (Chemical Vapor Deposition). The polysilicon layer is then doped to be of an N-type by ion implantation and is then patterned into a gate 114 by photolithography.

Subsequently, N$^-$ active regions 116 are formed as lightly doped drain (LDD) regions on the surface of the substrate 110 at opposite sides of the gate 114 by ion-implanting an N-type dopant. In particular, phosphorous (P) may be used at a low dose (e.g., at a dose of $1 \times 10^{13}$–$9 \times 10^{14}$ ions/cm$^2$) with the gate 114 being used as an ion-implanting mask.

Spacers 118 are then formed on the sidewalls of the gate 114 by depositing an insulating layer on the resultant structure, including the N$^-$ active regions 116, and then etching back the insulating layer by anisotropical etching such as RIE (Reactive Ion Etching). Here, the insulating layer is formed of a silicidation blocking material, such as a nitride or an oxide. Then, N$^+$ active regions 120 are formed as high-concentration source/drain regions on the surface of the substrate 110 at opposite sides of the spacers 118 by ion-implanting an N-type dopant. In particular, arsenic (As) may be used at a high dose (e.g., at or above a dose of $1 \times 10^{15}$ ions/cm$^2$) with the spacers 118 and the gate 114 being used as an ion-implanting mask.

Afterwards, a silicide forming metal material, such as titanium (Ti) is deposited on the resultant structure, including the N$^+$ active regions 120, and the titanium is subjected to rapid thermal annealing (RTA) or thermal treatment using a furnace so that silicidation takes place in an area where the titanium contacts silicon. As a result, a titanium silicide (TiSi$_2$) layer is formed on the surfaces of the exposed N$^-$ and N$^+$ active regions 116 and 120 and on the gate 114. Then, an unreacted titanium layer is selectively removed, using an etchant which does not damage the silicide layer 122, the silicon substrate 110, or the gate insulating layer 112.

A problem with the conventional method is incomplete silicidation on the surface of a narrow active region (see "A" of FIG. 1). This is believed to be caused by the impurity concentration in the silicon substrate 110. In other words, with the ion-implantation on the silicon substrate 110 at or above a dose of $1 \times 10^{15}$ ions/cm$^2$, impurities contained in the silicon in excess of their solid solubility limit are segregated or piled up at the titanium/silicon interface, thereby blocking the diffusion of silicon. This phenomenon is observed to be more serious with arsenic than with phosphorous.

As a result, the diffusion of silicon is more difficult in the narrow region A of FIG. 1 between gates 114, than in the remainder of the device. This can lead to incomplete silicidation as compared to a wide region or an increased sheet resistance. For example, when the source region of a transistor, coupled to a common source terminal (V$_{ss}$) of memory cells, is narrow, silicon of a substrate is not sufficiently diffused in the narrow region during the step of forming a titanium silicide layer. As a result, the sheet resistance from the source region to a V$_{ss}$ pattern may increase. In a worse case situation, no suicide layer may be formed at all, thereby reducing a voltage margin in a low-voltage operation area of a device.

As a separate issue, a general problem with CMOS circuits is their propensity to "latch-up". Latch-up arises from the presence of complementary parasitic bipolar transistor structures, which result from fabrication of complementary MOS devices in a CMOS structure. Because they are in close proximity to one another, the complementary bipolar structures can interact electrically to form device structures which behave like p-n-p-n diodes.

This is a phenomenon that establishes a very low-resistance path between the Vcc and Vss power lines, which in turn allows large currents to flow through the circuit. This can cause the circuit to malfunction or not function at all due to heat caused by high power dissipation. The latch-up phenomenon is triggered by a changing current incidental to the fluctuation of power supply voltage, a punch through current at a well boundary, etc. Such triggering currents may be and in practice are established in any one or more of a variety of ways, e.g., terminal overvoltage stress, transient displacement currents, ionizing radiation, or impact ionization by hot electrons.

FIG. 2 is a cross-sectional view of an SRAM cell comprising a CMOS device having a p-channel transistor 210 formed in an n-well 212 diffused into a p-type substrate 213, and an n-channel transistor 211 formed directly in the substrate 213. As shown in FIG. 2, two bipolar transistors 214 and 215 are parasitically formed in the SRAM cell.

When a trigger current is generated in the p-well 212, current flows through a resistance Rs, and the voltage drop across the resistance Rs turns on the bipolar transistor 214. When the bipolar transistor 214 turns on, a collector current thereof flows through a resistance Rw and a bias power supply Vcc. As a consequence, the base-emitter of the bipolar transistor 215 is biased in the forward direction, and the bipolar transistor 215 also turns on. When the bipolar transistor 215 turns on, the collector current thereof flows through the resistance Rs, further increasing the base potential of the bipolar transistor 214 which has already been turned on. Consequently, the collector current of the bipolar transistor 214 is again increased, further driving the bipolar transistor 215. As a result, the bipolar transistors 214 and 215 become completely turned on, and a large current flows from the bias power supply Vcc to the bias voltage Vss.

The bias voltages Vss to the p-well and Vcc to the n-well can be used to set the potentials of the p-well and n-well so as to suppress the latch-up phenomenon, i.e., to avoid the forward bias condition between the emitter and base electrodes of bipolar transistor 214. However, as shown in FIG. 3, in the conventional SRAM cell array, there are a plurality of circuit cells aligned and connected to each other. The bias voltage Vcc is supplied to the common n-well region in which the p-channel MOS transistors of the cells are strapped. Similarly, Vss is supplied to the common p-well region in which the n-channel MOS transistors of cells are formed. The conductive contact for providing the bias voltage Vcc (or Vss) is located at only one portion of the common n-well (or common p-well). The increased resistance at areas distant from the biasing contacts causes undesirable power supply and ground noise. In this state, the latch-up phenomenon can still occur.

Another problem encountered with the SRAM CMOS device is "soft error". If energetic particles from the environment (e.g. alpha-particles) should happen to strike a junction (e.g., a drain junction) surrounded by a depletion region, electrons and holes will be generated within the underlying body of the semiconductor material and will collect along the boundary of the depletion region, and the voltage across the junction will be reduced by the charge perturbation. If the charge perturbation is sufficiently large, the stored logic state may be reversed. This is commonly referred to as a "soft error" since the error is not due to a hardware defect and since the cell will operate normally thereafter. Like latch up, soft errors are also increased by the unstable potential of a well stand-by operation at reduced voltages.

SUMMARY OF THE INVENTION

According to a first aspect of the present invention, a semiconductor device includes a substrate of a first conductive type; a well region of a second conductive type formed in the substrate, wherein the second conductive type is opposite the first conductive type; a first impurity region of the first conductive type extending to a first depth within the well region; a second impurity region of the first conductive type spaced from the first impurity region to define a channel region therebetween and extending to a second depth within the well region; a gate electrode located over the channel region; a silicide layer formed at a third depth within the first impurity region, wherein the third depth is less than the first depth, and wherein a difference between the first depth and the third depth is less than or equal to a difference at which a leakage current from the silicide layer to the well region is sufficient to electrically bias the well region through the silicide layer. Preferably, the second depth is greater than the first depth.

According to another aspect of the present invention, a semiconductor device includes a substrate of a first conductive type; a well region of a second conductive type formed in the substrate, wherein the second conductive type is opposite the first conductive type; a first impurity region of the first conductive type extending to a first depth within the well region; a second impurity region of the first conductive type spaced from the first impurity region to define a channel region therebetween and extending to a second depth within the well region; a gate electrode located over the channel region; and a silicide layer formed within the first impurity region and including protrusions extending downwardly from a bottom surface thereof and across a boundary between the first impurity region and the well region. Again, the second depth is preferably greater than the first depth.

According to still another aspect of the present invention, a semiconductor device includes a substrate of a first conductive type; a well region of a second conductive type formed in the substrate, wherein the second conductive type is opposite the first conductive type; first and second voltage nodes; a first transistor comprising (a) a first impurity region of the first conductive type extending to a first depth within the well region, (b) a second impurity region of the first conductive type spaced from the first impurity region to define a channel region therebetween and extending to a second depth within the well region, (c) a gate electrode located over the channel region, and (d) a silicide layer connected to the first voltage node and formed at a third depth within the first impurity region, wherein the third depth is less than the first depth, and wherein a difference between the first depth and the third depth is less than or equal to a difference at which a leakage current from the silicide layer to the well region is sufficient to electrically bias the well region through the silicide layer; and a second transistor comprising (a) a first impurity region of the second conductive type extending to a first depth within the substrate, (b) a second impurity region of the second conductive type spaced from the first impurity region to define a channel region therebetween and extending to a second depth within the substrate, (c) a gate electrode located over the channel region, and (d) a silicide layer connected to the second voltage node and formed at a third depth within the first impurity region, wherein the third depth is less than the first depth, and wherein a difference between the first depth and the third depth is less than or equal to a difference at which a leakage current from the silicide layer to the substrate is sufficient to electrically bias the substrate through the silicide layer.

According to yet another aspect of the present invention, a semiconductor device includes a substrate of a first conductive type; a well region of a second conductive type formed in the substrate, wherein the second conductive type is opposite the first conductive type; first and second voltage nodes; a first transistor comprising (a) a first impurity region of the first conductive type extending to a first depth within the well region, (b) a second impurity region of the first conductive type spaced from the first impurity region to define a channel region therebetween and extending to a second depth within the well region, (c) a gate electrode located over the channel region, and (d) a silicide layer connected to the first voltage node and formed within the first impurity region and including protrusions extending downwardly from the bottom surface thereof and across a boundary between the first impurity region and the well region; and a second transistor comprising (a) a first impurity region of the second conductive type extending to a first depth within the substrate, (b) a second impurity region of the second conductive type spaced from the first impurity region to define a channel region therebetween and extending to a second depth within the substrate, (c) a gate electrode located over the channel region, and (d) a suicide layer connected to the second voltage node and formed within the first impurity region and including protrusions extending downwardly from the bottom surface thereof and across a boundary between the first impurity region and the substrate.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE PREFERRED EMBODIMENTS

FIGS. 4(a) to 4(e) are sectional views of the creation of an N-channel MOS transistor. They are referred to for describing a semiconductor device fabricating method according to a first preferred embodiment of the present invention.

Figure 1:
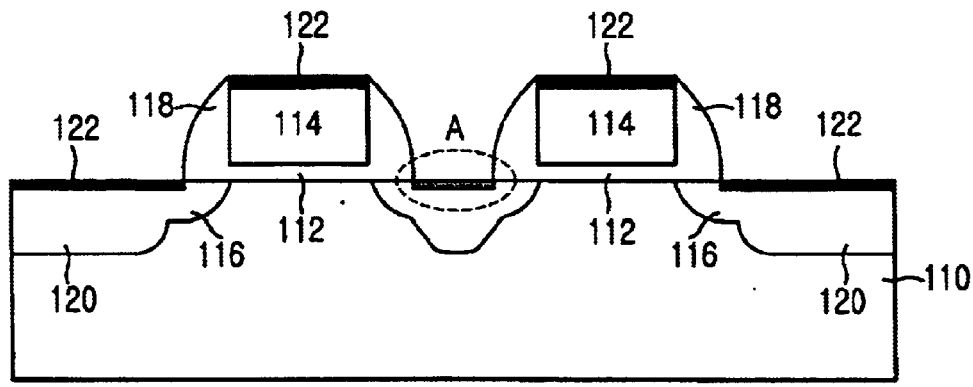
FIG. 1 is a vertical sectional view of a semiconductor device fabricated by a conventional salicide process.
Figure 2:
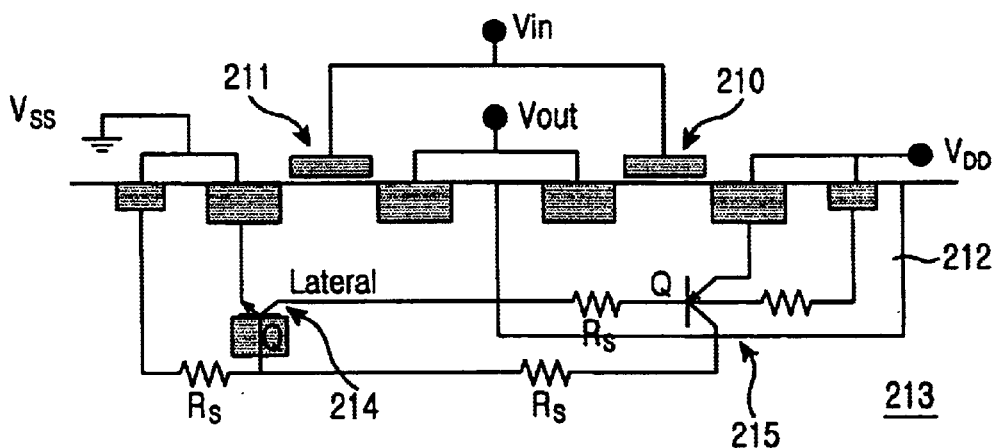
FIG. 2 is a vertical representation of a latch-up structure of a conventional CMOS invertor.
Figure 3:
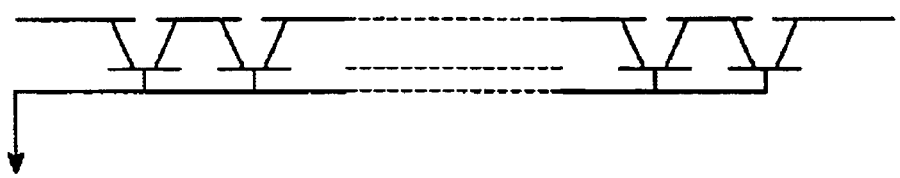
FIG. 3 is a diagram for explaining a well strapping line in a conventional SRAM memory cell.
Figure 4A:
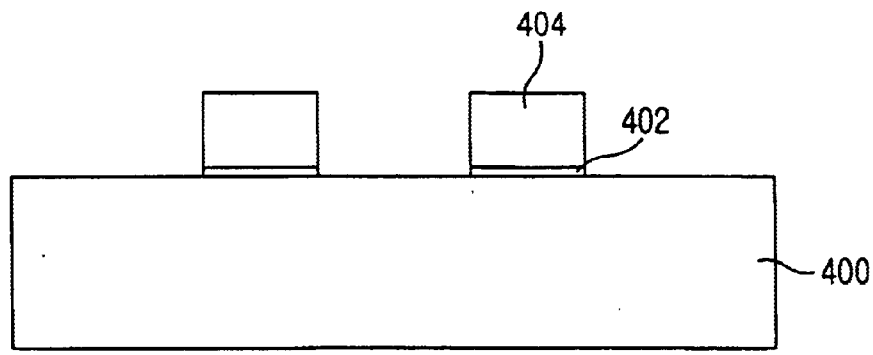
FIGS. 4(a) to 4(e) are sectional views sequentially illustrating a semiconductor device fabricating method according to an embodiment of the present invention.

FIG. 4(a) illustrates the step of forming a gate 404. A first insulating layer is first grown by performing a thermal oxidation on the surface of a silicon substrate 400 having an active region defined thereon by a field oxide film (not shown). A conductive layer is then formed over the first insulating layer to serve as a gate. A polysilicon layer formed by CVD may be used as this conductive layer. The polysilicon layer is then doped to be of an—type by ion-implantation and the polysilicon layer and the first insulating layer are then patterned into the gate insulating layers 402 and the gates 405 by photolithography. In this process, the N-doped polysilicon layer/may be deposited by CVD without ion-implantation.

Figure 4B:
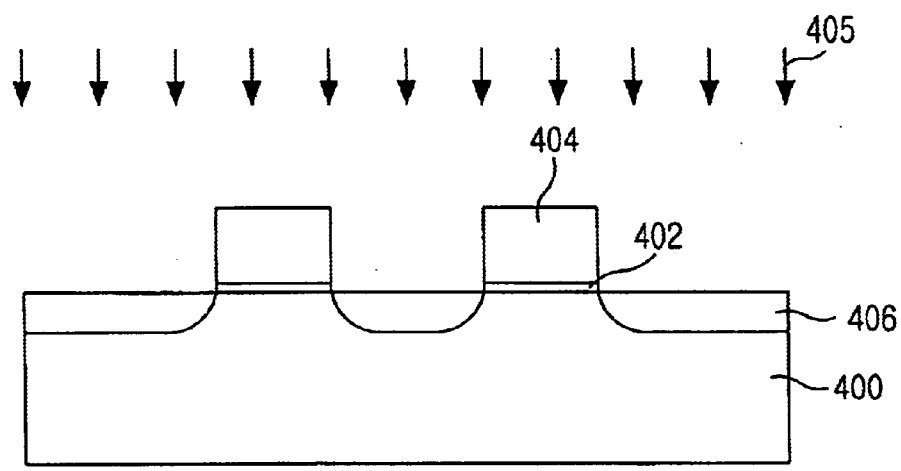

FIG. 4(b) illustrates the step of forming an N active region 406. Following the formation of the gate 404, N⁻ active regions 406 are formed as LDD regions on the surface of the substrate 400 at opposite sides of the gate 404 by ion-implanting an N-type dopant 405 using the gate 404 as an ion-implanting mask, phosphorous at a dose of $1\times10^{13}$ ions/cm² or above may be used.

Figure 4C:
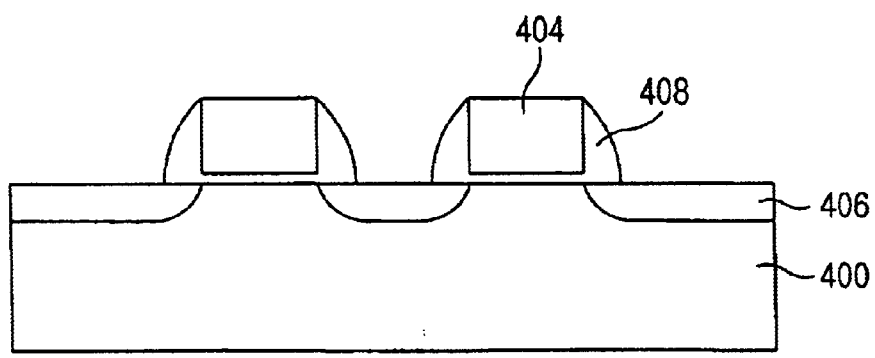

FIG. 4(c) illustrates the step of forming sidewall spacers 408. After the N⁻ active regions 406 are formed, an insulating layer is deposited on the resultant structure. Then, the insulating layer is etched back by anisotropical etching such as RIE, to thereby forming spacers 408 on the sidewalls of the gate 404. In this process, it is preferable to form the insulating layer of a silicidation blocking material, such as a nitride or an oxide.

Figure 4D:
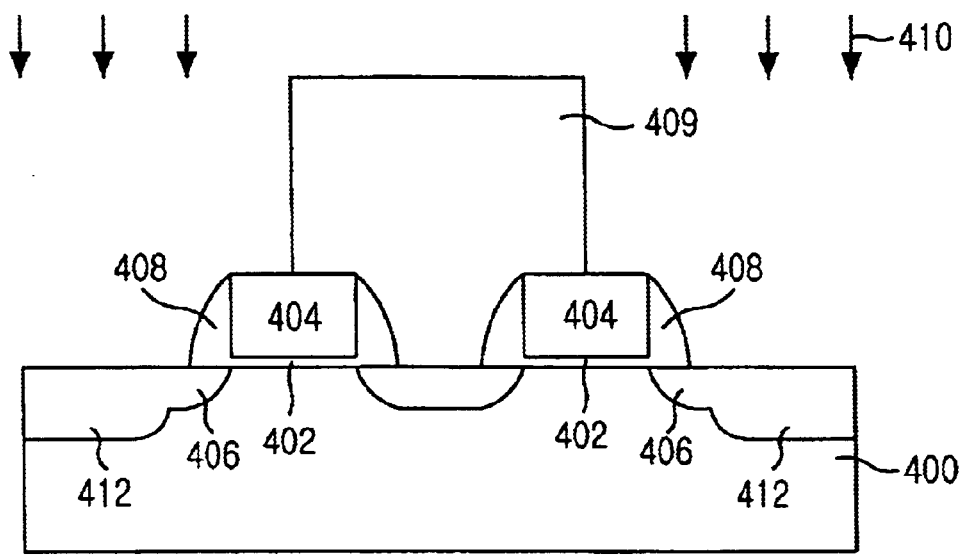

FIG. 4(d) illustrates the step of forming an N⁺ active region 412. Subsequent to the formation of the sidewall spacers 408, a photoresist pattern 409 is formed by photolithography, to mask a narrow region between gates 404. Assuming that the length of the sidewall spacers 108 is 0.15 μm, the distance between the gates 404 is between 0.35 and 0.5 μm, and thus the active region is about 0.1 μm long. This region is masked by the photoresist pattern 409.

Then, N⁺ active regions 412 are formed as high-concentration source/drain regions on the surface of the substrate 400 at opposite sides of the sidewall spacers 408 by ion-implanting an N-type dopant 410 using the photoresist pattern 409 used as an ion-implanting mask. The dopant 410 may be, for example, arsenic at a dose of $1\times10^{15}$ ions/cm² or above. Because the region masked by the photoresist pattern 409 experiences no N⁺ ion-implantation, there exist no impurities beyond their solid solubility which block silicon diffusion in the masked region.

Figure 4E:
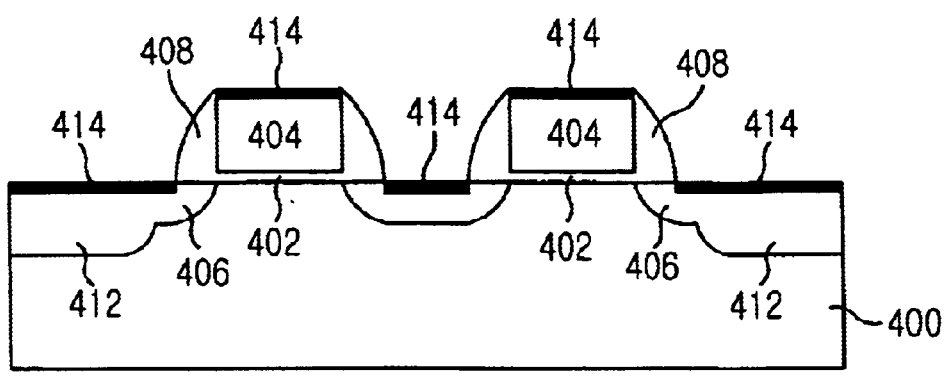

FIG. 4(e) illustrates the step of forming a silicide layer 414. After the N⁺ active regions 412 are formed, the photoresist pattern 409 is removed. Then, a silicide forming metal material such as titanium, cobalt (Co), or tantalum (Ta) is deposited on the resultant structure. The metal material is subjected to RTA or thermal annealing using a furnace so that silicidation takes place in an area where the metal material contacts silicon. As a result, the silicide layer 414, such as a titanium silicide ($TiSi_2$) layer, a cobalt silicide ($CoSi_2$) layer, or tantalum silicide ($TaSi_2$) layer, is formed on the surfaces of the exposed active regions 406 and 412, and the gate 404. Then, any unreacted titanium layer is selectively removed, using an etchant which does not damage the silicide layer 414, the silicon substrate 400, or the gate insulating layer 402.

Though not shown, a contact window is formed to expose portions of the N⁺ active regions 412 by depositing an insulating layer on the resultant structure having the silicide layer 414 formed thereon and anisotropically etching the insulating layer. The etching may be carried out, for example, by RIE in a photolithography process. A metal layer is then formed to contact with the N⁺ active region 412 or the suicide layer 414 by filling the contact window with a metal. In this way, an intended transistor can be driven.

The above fabricating method can also find its applications in a semiconductor device with a narrow active region produced by a short distance between a gate edge and an active region edge, that is, between a gate edge and a field region.

The first embodiment, as described above, avoids ion-implantation at a high dose in a narrow region between gates or a narrow active region by masking the narrow region. As a result, there is no impurity beyond its solid solubility, which blocks diffusion of silicon in the narrow region.

A second embodiment of the present invention will now be described with reference to FIGS. 5–8.

Figure 5:
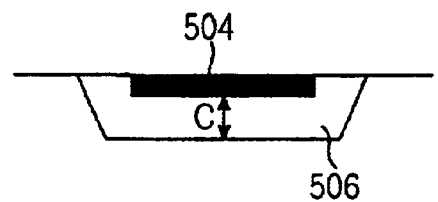
FIGS. 5 and 6 are sectional views for use in explaining concepts associated with a second embodiment of the present invention.

As semiconductor devices are scaled down, shallow junctions are formed due to the reduction of source/drain area and junction depth. Referring to FIG. 5, junction leakage current is dependent on the distance "c" between the bottom of silicide layer 504 and a junction of an active region 506. Generally, when the distance is around or below 500 Å, the junction leakage current abruptly increases. See, for example, the article entitled "High performance RF characteristics of raised gate/source/drain CMOS with Co salicide", by T. Ohguro et al., VLSI Tech. Dig., page 136 (1998).

Figure 6:
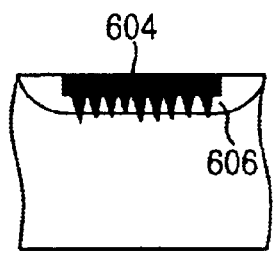

In addition, for example in a cobalt-silicide junction where the salicide process is executed after the junction formation, anomalous Co diffusion can occur, causing a roughness of the $CoSi_2$ layer. Referring to FIG. 6, spike shaped protrusions of the rough silicide layer 604 may protrude into or even through an active layer 606, thus substantially increasing junction leakage.

However, rather than avoiding junction leakage as in the prior art, the present embodiment configures the silicide and active layers to create sufficient junction leakage so as to provide a current sufficient to achieve a voltage for an underlying well region. More particularly, the present embodiment concerns structures for providing a reference voltage simultaneously to a well and to an active region. In this manner, a source region of a transistor and a well-tie region are merged together, thereby providing high integration density.

Figure 7:
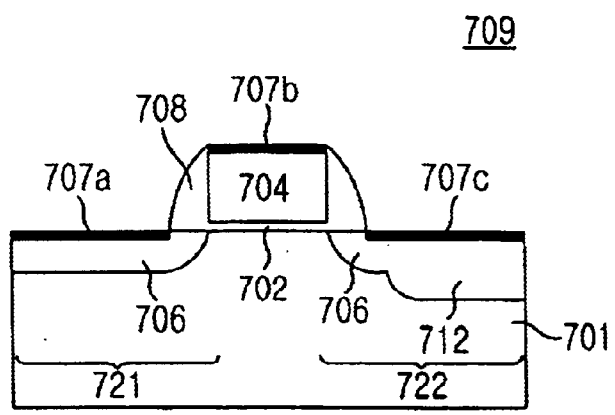
FIG. 7 is a sectional view of a semiconductor device according to the second embodiment of the present invention.

FIG. 7 shows a device in accordance with the second embodiment of the present invention. As shown, a well region 701 of a first conductive type resides in a semiconductor substrate 709. A gate insulating layer 702 and a gate 704 are sequentially formed on the well region 701. A shallow impurity (active) region 706 of a second conductive type is formed at the surface of the well region 701 by ion-implanting a first impurity of a second conductive type, using the gate 704 as a mask. In this manner, the shallow impurity region 706 is formed in both of source and drain regions 721 and 722. The second conductive type is the opposite of the first conductive type. Sidewall spacers 708 are formed of an insulating material on the sidewalls of the gate 704. A deep impurity (active) region 712 of the second conductive type is then formed only in the drain region 722 by masking the source region 721. (See, for example, the mask 409 of FIG. 4(d) and the corresponding discussion above.) The deep impurity region 712 extends to a greater depth then the shallow impurity region 706, and accordingly, the impurity region of the drain 722 extends to a greater depth than the impurity region of the source 721. Silicide layers 707a and 707b are then respectively formed over exposed portions of the source region 721 and the drain region 722, and silicide layer 707b is formed over the gate 704.

Preferably, a bottom surface of the suicide layer 707a does not penetrate into the well region 701 through the shallow impurity layer 706 of the source region 721. However, the difference in depth between the silicide layer 707a and shallow impurity region 706 is so small (for example, "c" in FIG. 5 is less than 500 Å) that the resultant leakage current is sufficient to electrically connect the well region 701 to a ground node Vss (or supply voltage node Vcc) through the silicide layer 707a. Alternately, or in addition, protrusions from the bottom surface of the silicide layer 707a extends into the well region 701 (see FIG. 6) such that the well region 701 is electrically connected to the ground Vss or a supply voltage Vcc node through the silicide layer 707a.

In this manner, for example, in the case of a p-type well and an NMOS transistor, the well region and the source region can be simultaneously biased with a ground voltage Vss through the silicide layer in the source region. On the other hand, in the case of an n-type well and a PMOS transistor, a power supply voltage Vcc may be supplied to both the source region and the well region through the silicide layer in the source region.

As a result of the above-described structure of the present embodiment, the bias-voltage supplied to the well region and a source region for a semiconductor device can be provided simultaneously using a single conductive contact. Advantageously, the space otherwise used for biasing the reference voltage to the well is not needed.

Preferably, the depth of the shallow impurity region at the source region is less than 0.1 um, and also preferably, the thickness of the silicide layer is 400–800 Å. The distance (gap "c") between bottom surfaces of the two layers (silicide layer and first active region) is preferably less than 500 Å, and more preferably less than 400 Å. Preferably, in the case of an NMOS transistor, the source impurity is As or Sb at 8.0E14, and in the case of a PMOS transistor, the source impurity is $BF_2$ at 1.2E14.

Figure 8:
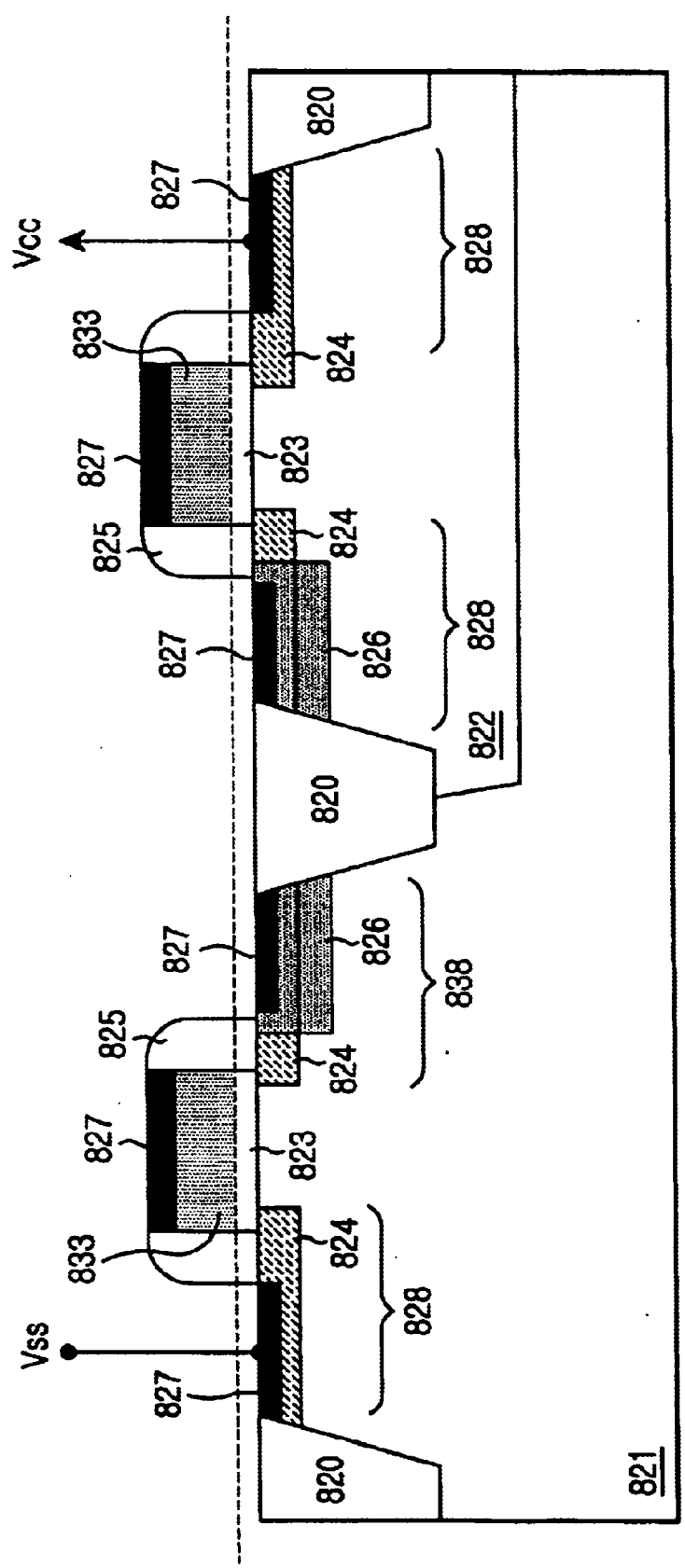
FIG. 8 is a sectional view of a semiconductor device according to the third embodiment of the present invention.

FIG. 8 is for describing a CMOS device according to the second embodiment of the present invention. This CMOS structure is especially suitable for SRAM cells which have body terminals connected to a ground (Vss) or supply voltage (Vcc) node. These cells can be realized utilizing CMOS technology to create planar structures with a minimum of masking steps and process complexity.

Referring to FIG. 8, trench isolation structures 820 are formed at predetermined locations of a semiconductor substrate. A p-well region 821 and a neighboring n-well region 822 are defined in the substrate as shown. Gate insulating layers 823 and gates 833 are formed on the surface of the p-well region 821 and the n-well region 822.

An NMOS transistor formed in the p-well region 821 comprises a source region 828 having an $n^-$-type impurity region 824 on one side of the gate 833, and a drain region 838 having $n^+$-type impurity region 826 which overlaps an $n^-$-type impurity region 824 on the other side of the gate 833. The $n^+$-type impurity region 826 is narrower than the $n^-$-type impurity region 824 and extends to a greater depth than the $n^-$-type impurity region 824. As in the configuration of FIG. 7, the source region is made devoid of a deep $n^+$-type impurity region by masking of the source region during implantation of the $n^+$-type impurity region 826 in the drain region. (See again, for example, the mask 409 of FIG. 4(d) and the corresponding discussion above.)

Preferably, a bottom surface of the silicide layer 827 does not penetrate into the p-well region 821 through the $n^-$-type impurity region 824 of the NMOS source region 828. However, the difference in depth between the silicide layer 827 and $n^-$-type impurity region 824 is so small (for example, "c" in FIG. 5 is less than 500 Å) that the resultant leakage current is sufficient to electrically connect the p-well region 821 to a ground node Vss through the suicide layer 827. Alternately, or in addition, protrusions from the bottom surface of the silicide layer 827 extend into the p-well region 821 (see FIG. 6) such that the p-well region 821 is electrically connected to the ground node Vss through the silicide layer 827.

Similarly, a PMOS transistor formed in the n-well region 822 comprises a source region 828 having an $p^-$-type impurity region 824 on one side of the gate 833, and a drain region 838 having $p^+$-type impurity region 826 which overlaps an $p^-$-type impurity region 824 on the other side of the gate 833. The $p^+$-type impurity region 826 is narrower than the $p^-$-type impurity region 824 and extends to a greater depth than the $p^-$-type impurity region 824. As above, the source region is made devoid of a deep $p^+$-type impurity region by masking of the source region during implantation of the p⁺-type impurity region 826 in the drain region. (Once again see, for example, the mask 409 of FIG. 4(*d*) and the corresponding discussion above.)

Likewise, a bottom surface of the silicide layer 827 preferably does not penetrate into the n-well region 822 through the p⁻-type impurity region 824 of the PMOS source region 828. However, the difference in depth between the silicide layer 827 and p⁻-type impurity region 824 is so small (for example, "c" in FIG. 5 is less than 500 Å) that the resultant leakage current is sufficient to electrically connect the n-well region 822 to a power supply node Vcc through the silicide layer 827. Alternately, or in addition, protrusions from the bottom surface of the silicide layer 827 extend into the n-well region 822 (see FIG. 6) such that the n-well region 822 is electrically connected to the power supply node Vcc through the silicide layer 827.

In the CMOS device according to the second embodiment of the invention, both the p-well region 821 and the source region 828 of the NMOS transistor can be electrically connected to a ground line Vss through the silicide layer 827 contained in the source region 828 of the NMOS transistor. Similarly, both the n-well region 822 and the source region 828 of the PMOS transistor can be electrically connected to a power supply line Vcc through the silicide layer 827 contained in the source region 828 of the PMOS transistor. Consequently, parasitic resistances are reduced, and latch-up can be avoided by providing stable bias-voltages for the well of each cell in a CMOS SRAM device. Also, the bias-voltages supplied to the well regions and a source regions of the CMOS device can be provided simultaneously using common conductive contacts, and accordingly, the space otherwise used for biasing the reference voltage to the well is not needed.

Although the present invention has been described above in connection with the preferred embodiments thereof, the invention may, however, be embodied in many different forms without departing from the true spirit and scope thereof as defined by the appended claims.

What is claimed is:

1. A semiconductor device comprising:
    a substrate of a first conductive type;
    a well region of a second conductive type formed in the substrate, wherein the second conductive type is opposite the first conductive type;
    a first impurity region of the first conductive type extending to a first depth within the well region;
    a second impurity region of the first conductive type spaced from the first impurity region to define a channel region therebetween and extending to a second depth within the well region;
    a gate electrode located over the channel region;
    a silicide layer formed at a third depth within the first impurity region, wherein the third depth is less than the first depth, and wherein a difference between the first depth and the third depth is less than or equal to a difference at which a leakage current from the silicide layer to the well region is sufficient to electrically bias the well region through the silicide layer.

2. The semiconductor device of claim 1, wherein the second depth is greater than the first depth.

3. The semiconductor device of claim 1, wherein the silicide layer is electrically connected to a source voltage, and wherein the source voltage biases both the first impurity region and the well region.

4. The semiconductor device of claim 3, wherein the first conductivity type is a p-type and the second conductivity type is an n-type, and wherein the source voltage is a power supply voltage Vcc.

5. The semiconductor device of claim 3, wherein the first conductivity type is an n-type and the second conductivity type is a p-type, and wherein the source voltage is a ground voltage Vss.

6. The semiconductor device of claim 1, wherein a bottom surface of the silicide layer extends to the third depth within the impurity region, and wherein the silicide layer further includes protrusions extending downwardly from the bottom surface thereof.

7. The semiconductor device of claim 6, wherein the protrusion extend across a boundary between the first impurity region and the well region.

8. The semiconductor device of claim 1, wherein the difference between the first depth and the third depth is less than 500 Å.

9. The semiconductor device of claim 1, wherein the difference between the first depth and the third depth is less than 400 Å.

10. The semiconductor device of claim 1, wherein the first impurity region of the first conductive type is formed by As or Sb.

11. The semiconductor device of claim 1, wherein the silicide layer has a thickness of 400 to 800 angstroms.

12. The semiconductor device of claim 1, wherein a junction depth of the first impurity region is less than 0.1 microns.

13. A semiconductor device comprising:
    a substrate of a first conductive type;
    a well region of a second conductive type formed in the substrate, wherein the second conductive type is opposite the first conductive type;
    a first impurity region of the first conductive type extending to a first depth within the well region;
    a second impurity region of the first conductive type spaced from the first impurity region to define a channel region therebetween and extending to a second depth within the well region;
    a gate electrode located over the channel region; and
    a silicide layer formed within the first impurity region and including protrusions extending downwardly from a bottom surface thereof and across a boundary between the first impurity region and the well region.

14. The semiconductor device of claim 13, wherein the second depth is greater than the first depth.

15. The semiconductor device of claim 13, wherein the suicide layer is electrically connected to a source voltage, and wherein the source voltage biases both the first impurity region and the well region.

16. The semiconductor device of claim 15, wherein the first conductivity type is a p-type and the second conductivity type is an n-type, and wherein the source voltage is a power supply voltage Vcc.

17. The semiconductor device of claim 15, wherein the first conductivity type is an n-type and the second conductivity type is a p-type, and wherein the source voltage is a ground voltage Vss.

18. The semiconductor device of claim 13, wherein the first impurity region of the first conductive type is formed by As or Sb.

19. The semiconductor device of claim 13, wherein the silicide layer has a thickness of 400 to 800 angstroms.

20. The semiconductor device of claim 13, wherein a junction depth of the first impurity region is less than 0.1 microns.

21. A semiconductor device comprising:
a substrate of a first conductive type;
a well region of a second conductive type formed in the substrate, wherein the second conductive type is opposite the first conductive type;
first and second voltage nodes;
a first transistor comprising (a) a first impurity region of the first conductive type extending to a first depth within the well region, (b) a second impurity region of the first conductive type spaced from the first impurity region to define a channel region therebetween and extending to a second depth within the well region, (c) a gate electrode located over the channel region, and (d) a silicide layer connected to the first voltage node and formed at a third depth within the first impurity region, wherein the third depth is less than the first depth, and wherein a difference between the first depth and the third depth is less than or equal to a difference at which a leakage current from the silicide layer to the well region is sufficient to electrically bias the well region through the silicide layer; and
a second transistor comprising (a) a first impurity region of the second conductive type extending to a first depth within the substrate, (b) a second impurity region of the second conductive type spaced from the first impurity region to define a channel region therebetween and extending to a second depth within the substrate, (c) a gate electrode located over the channel region, and (d) a silicide layer connected to the second voltage node and formed at a third depth within the first impurity region, wherein the third depth is less than the first depth, and wherein a difference between the first depth and the third depth is less than or equal to a difference at which a leakage current from the silicide layer to the substrate is sufficient to electrically bias the substrate through the silicide layer.

22. The semiconductor device of claim 21, wherein the second depth is greater than the first depth in each of the first and second transistors.

23. The semiconductor device of claim 21, wherein the first conductivity type is an n-type and the second conductivity type is a p-type, and wherein the first voltage node is a ground node Vss and the second voltage node is a power supply voltage Vcc.

24. The semiconductor device of claim 21, wherein the first conductivity type is a p-type and the second conductivity type is an n-type, and wherein the first voltage node is a power supply voltage Vcc and the second voltage node is a ground node Vss.

25. The semiconductor device of claim 21, wherein a bottom surface of the silicide layer of the first transistor extends to the third depth within the impurity region of the first transistor, and wherein the silicide layer of the first transistor further includes protrusions extending downwardly from the bottom surface thereof.

26. The semiconductor device of claim 21, wherein the protrusions extend across a boundary between the first impurity region of the first transistor and the well region.

27. The semiconductor device of claim 21, wherein a bottom surface of the silicide layer of the second transistor extends to the third depth within the impurity region of the second transistor, and wherein the suicide layer of the second transistor further includes protrusions extending downwardly from the bottom surface thereof.

28. The semiconductor device of claim 27, wherein the protrusions extend across a boundary between the first impurity region of the second transistor and the substrate.

29. The semiconductor device of claim 21, wherein the difference between the first depth and the third depth is less than 500 Å for each of the first and second transistors.

30. The semiconductor device of claim 21, wherein the difference between the first depth and the third depth is less than 400 Å for each of the first and second transistors.

31. The semiconductor device of claim 21, wherein the first impurity region of the first conductive type is formed by As or Sb.

32. The semiconductor device of claim 21, wherein the silicide layer of the first transistor has a thickness of 400 to 800 angstroms.

33. The semiconductor device of claim 21, wherein a junction depth of the first impurity region is less than 0.1 microns.

34. A semiconductor device comprising:
a substrate of a first conductive type;
a well region of a second conductive type formed in the substrate, wherein the second conductive type is opposite the first conductive type;
first and second voltage nodes;
a first transistor comprising (a) a first impurity region of the first conductive type extending to a first depth within the well region, (b) a second impurity region of the first conductive type spaced from the first impurity region to define a channel region therebetween and extending to a second depth within the well region, (c) a gate electrode located over the channel region, and (d) a silicide layer connected to the first voltage node and formed within the first impurity region and including protrusions extending downwardly from the bottom surface thereof and across a boundary between the first impurity region and the well region; and
a second transistor comprising (a) a first impurity region of the second conductive type extending to a first depth within the substrate, (b) a second impurity region of the second conductive type spaced from the first impurity region to define a channel region therebetween and extending to a second depth within the substrate, (c) a gate electrode located over the channel region, and (d) a silicide layer connected to the second voltage node and formed within the first impurity region and including protrusions extending downwardly from the bottom surface thereof and across a boundary between the first impurity region and the substrate.

35. The semiconductor device of claim 34, wherein the second depth is greater than the first depth for each of the first and second transistors.

36. The semiconductor device of claim 34, wherein the first conductivity type is an n-type and the second conductivity type is a p-type, and wherein the first voltage node is a ground node Vss and the second voltage node is a power supply voltage Vcc.

37. The semiconductor device of claim 34, wherein the first conductivity type is a p-type and the second conductivity type is an n-type, and wherein the first voltage node is a power supply voltage Vcc and the second voltage node is a ground node Vss.

38. The semiconductor device of claim 34, wherein the first impurity region of the first conductive type is formed by As or Sb.

39. The semiconductor device of claim 34, wherein the silicide layer of the first transistor has a thickness of 400 to 800 angstroms.

40. The semiconductor device of claim 34, wherein a junction depth of the first impurity region is less than 0.1 microns.

* * * * *